United States Patent
Lin et al.

(10) Patent No.: US 8,575,018 B2
(45) Date of Patent: Nov. 5, 2013

(54) SEMICONDUCTOR DEVICE AND METHOD OF FORMING BUMP STRUCTURE WITH MULTI-LAYER UBM AROUND BUMP FORMATION AREA

(75) Inventors: Yaojian Lin, Singapore (SG); Jianmin Fang, Singapore (SG); Kang Chen, Singapore (SG); Pandi Chelvam Marimuthu, Singapore (SG); Rajendra D. Pendse, Fremont, CA (US)

(73) Assignee: STATS ChipPAC, Ltd., Singapore (SG)

( * ) Notice: Subject to any disclaimer, the term of this patent is extended or adjusted under 35 U.S.C. 154(b) by 686 days.

(21) Appl. No.: 12/628,631

(22) Filed: Dec. 1, 2009

(65) Prior Publication Data
US 2011/0127668 A1 Jun. 2, 2011
US 2012/0299176 A9 Nov. 29, 2012

Related U.S. Application Data

(63) Continuation-in-part of application No. 11/671,900, filed on Feb. 6, 2007, now Pat. No. 7,723,225.

(60) Provisional application No. 60/766,718, filed on Feb. 7, 2006.

(51) Int. Cl.
*H01L 21/44* (2006.01)

(52) U.S. Cl.
USPC ........... 438/613; 438/612; 438/614; 257/737; 257/738; 257/758; 257/779; 257/780; 257/E21.523; 257/E21.59; 257/E23.015; 257/E23.02; 257/E23.021

(58) Field of Classification Search
USPC .......... 438/674, 669, 613, 614, 612; 257/758, 257/779, 753, E23.142, 737, 738, 759, 257/E23.015, E21.523, E21.59, E23.02, 257/E23.021, 780
See application file for complete search history.

(56) References Cited

U.S. PATENT DOCUMENTS

| | | | | |
|---|---|---|---|---|
| 5,444,022 A * | 8/1995 | Gardner | ......... | 438/627 |
| 5,894,170 A * | 4/1999 | Ishikawa | ......... | 257/775 |
| 6,191,489 B1 * | 2/2001 | Igel et al. | ......... | 257/778 |
| 6,596,619 B1 | 7/2003 | Wang et al. | | |
| 6,819,002 B2 | 11/2004 | Chen et al. | | |
| 6,878,633 B2 | 4/2005 | Raskin et al. | | |
| 6,967,399 B2 | 11/2005 | Aiba et al. | | |
| 7,043,830 B2 | 5/2006 | Farnworth | | |
| 7,135,355 B2 | 11/2006 | Chan et al. | | |
| 7,144,759 B1 | 12/2006 | Hilton et al. | | |
| 7,375,020 B2 | 5/2008 | Wu et al. | | |
| 2003/0111731 A1 * | 6/2003 | Tomimori et al. | ......... | 257/758 |
| 2005/0250304 A1 | 11/2005 | Hedler et al. | | |
| 2006/0103020 A1 | 5/2006 | Tong et al. | | |
| 2007/0029669 A1 | 2/2007 | Stepniak et al. | | |
| 2007/0184578 A1 * | 8/2007 | Lin et al. | ......... | 438/106 |

* cited by examiner

*Primary Examiner* — Kimberly Rizkallah
*Assistant Examiner* — Maria Ligai
(74) *Attorney, Agent, or Firm* — Robert D. Atkins; Patent Law Group: Atkins & Associates, P.C.

(57) ABSTRACT

A semiconductor wafer has a first conductive layer formed over its active surface. A first insulating layer is formed over the substrate and first conductive layer. A second conductive layer is formed over the first conductive layer and first insulating layer. A UBM layer is formed around a bump formation area over the second conductive layer. The UBM layer can be two stacked metal layers or three stacked metal layers. The second conductive layer is exposed in the bump formation area. A second insulating layer is formed over the UBM layer and second conductive layer. A portion of the second insulating layer is removed over the bump formation area and a portion of the UBM layer. A bump is formed over the second conductive layer in the bump formation area. The bump contacts the UBM layer to seal a contact interface between the bump and second conductive layer.

24 Claims, 6 Drawing Sheets

SEMICONDUCTOR DEVICE AND METHOD OF FORMING BUMP STRUCTURE WITH MULTI-LAYER UBM AROUND BUMP FORMATION AREA

CLAIM TO DOMESTIC PRIORITY

The present application is a continuation-in-part of U.S. patent application Ser. No. 11/671,900, filed Feb. 6, 2007, now U.S. Pat. No. 7,723,225, which claims the benefit of U.S. Provisional Application No. 60/766,718, filed Feb. 7, 2006.

FIELD OF THE INVENTION

The present invention relates in general to semiconductor devices and, more particularly, to a semiconductor device and method of forming a bump structure over a semiconductor wafer with multi-layer UBM around a bump formation area.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

FIG. 1 shows a conventional bump structure formed over semiconductor wafer 10 containing a base substrate material such as silicon, germanium, gallium arsenide, indium phosphide, or silicon carbide, for structural support. A plurality of semiconductor die is formed on semiconductor wafer 10. Each semiconductor die has an active surface 12 containing analog or digital circuits implemented as active devices, passive devices, conductive layers, and dielectric layers formed within the die and electrically interconnected according to the electrical design and function of the die. Metal interconnect pads 14 are formed over active surface 12. Metal pads 14 are electrically connected to circuitry on active surface 12. A passivation layer 16 is formed over active surface 12 and metal pads 14. A portion of passivation layer 16 is removed by an etching process to expose metal pads 14. An electrically conductive layer 18 is formed over metal pads 14 and passivation layer 16. Conductive layer 18 operates as a redistribution layer (RDL) to extend horizontal interconnect of metal pads 14. A passivation layer 20 is formed over conductive layer 18 and passivation layer 16. A portion of passivation layer 20 is removed by an etching process to expose conductive layer 18. Bumps 22 are formed over conductive layer 18 in the removed portions of passivation layer 20.

The contact interface between bumps 22 and RDL 18 are subject to rejection or failure, particularly during manufacturing reliability testing. Passivation layer 20 is intended to maintain the seal for the contact interface between bumps 22 and RDL 18. However, if passivation layer 20 delaminates from bumps 22, moisture can penetrate through the separation between the passivation material and bump and cause oxidation around the contact interface between bumps 22 and RDL 18. The oxidation weakens the contact interface. The device can be rejected by post-reliability inspection, or the device could fail in the field.

SUMMARY OF THE INVENTION

A need exists to reduce failure of bump structures on semiconductor devices. Accordingly, in one embodiment, the present invention is a method of making a semiconductor device comprising the steps of providing a substrate, forming a first conductive layer over the substrate, forming a first insulating layer over the substrate and first conductive layer, removing a portion of the first insulating layer to expose the first conductive layer, forming a second conductive layer over the first conductive layer and first insulating layer, and forming a UBM layer around a bump formation area over the second conductive layer. The second conductive layer is exposed in the bump formation area. The method further includes the steps of forming a second insulating layer over the UBM layer and second conductive layer, removing a portion of the second insulating layer over the bump formation area and a portion of the UBM layer, and forming a bump over the second conductive layer in the bump formation area. The bump contacting the UBM layer to seal a contact interface between the bump and second conductive layer.

In another embodiment, the present invention is a method of making a semiconductor device comprising the steps of providing a substrate, forming a first conductive layer over the substrate, forming a first insulating layer over the substrate, forming a second conductive layer over the first conductive layer and first insulating layer, and forming a multi-layer metallization pattern around an interconnect formation area over the second conductive layer. The second conductive layer is exposed in the interconnect formation area. The method further includes the steps of forming a second insulating layer over the multi-layer metallization pattern and second conductive layer outside the interconnect formation area, and forming an interconnect structure over the second conductive layer in the interconnect formation area.

In another embodiment, the present invention is a method of making a semiconductor device comprising the steps of providing a substrate, forming a first conductive layer over the substrate, forming a multi-layer metallization pattern around an interconnect formation area over the first conductive layer, forming a first insulating layer over the multi-layer metallization pattern and first conductive layer outside the interconnect formation area, and forming an interconnect over the first conductive layer in the interconnect formation area.

In another embodiment, the present invention is a semiconductor device comprising a semiconductor die and first conductive layer formed over the semiconductor die. A first insulating layer is formed over the semiconductor die. A second conductive layer is formed over the first conductive layer and first insulating layer. A multi-layer metallization pattern is formed around an interconnect formation area over the second conductive layer. A second insulating layer is formed over the multi-layer metallization pattern and second conductive layer outside the bump formation area. An interconnect structure is formed over the second conductive layer in the interconnect formation area.

DETAILED DESCRIPTION OF THE DRAWINGS

Figure 1:
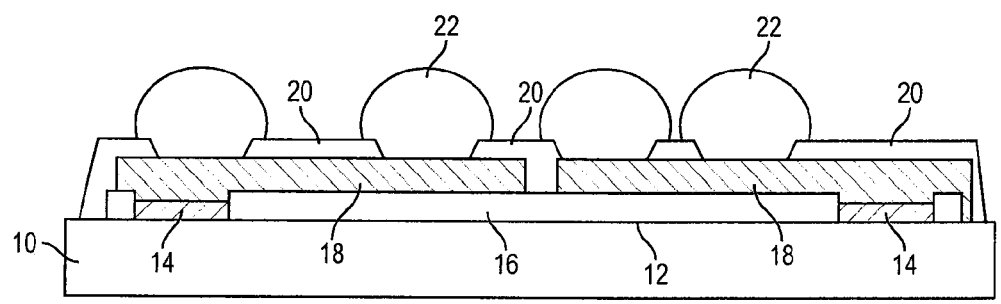
FIG. 1 illustrates a conventional bump structure formed over a semiconductor wafer.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along nonfunctional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
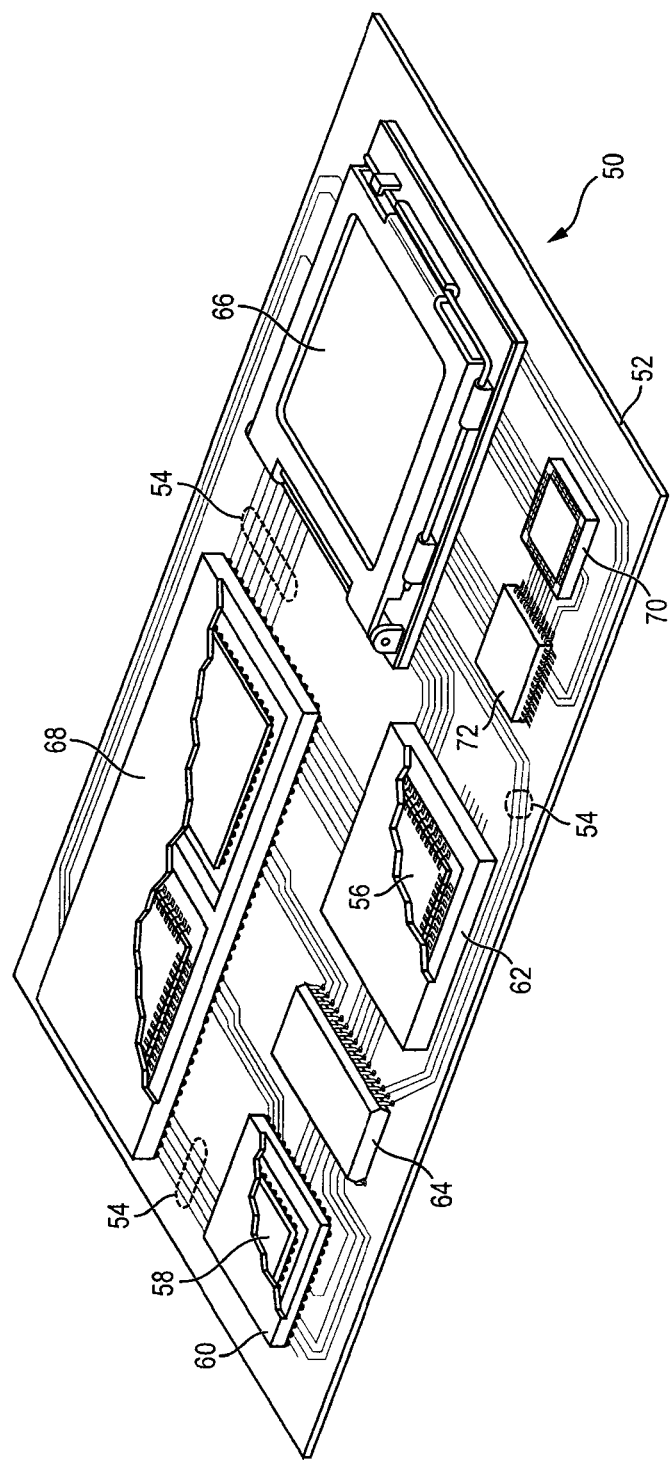
FIG. 2 illustrates a PCB with different types of packages mounted to its surface.

FIG. 2 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 2 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
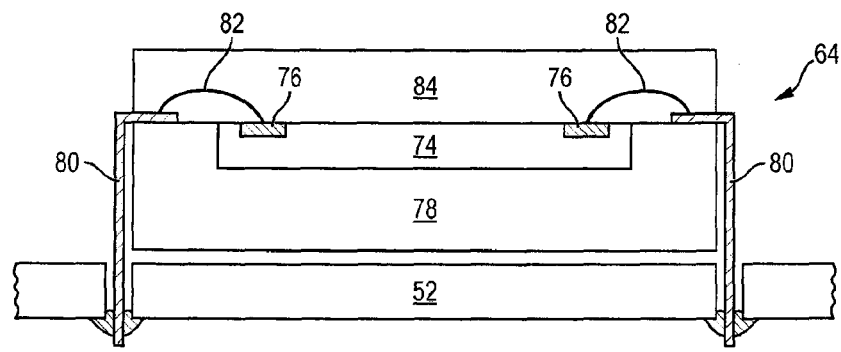
FIGS. 3a-3c illustrate further detail of the representative semiconductor packages mounted to the PCB.
Figure 3B:
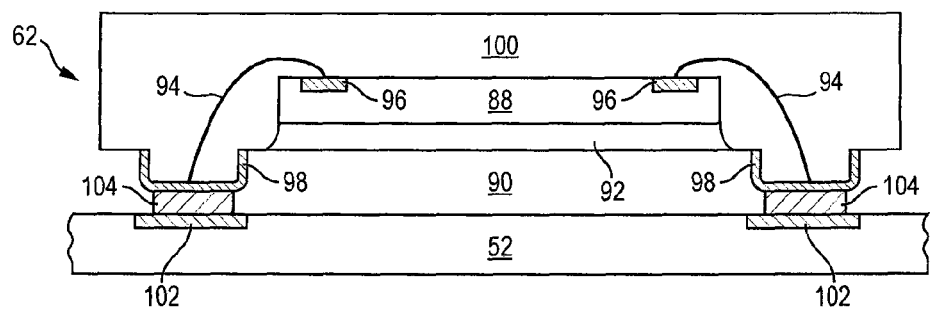
Figure 3C:
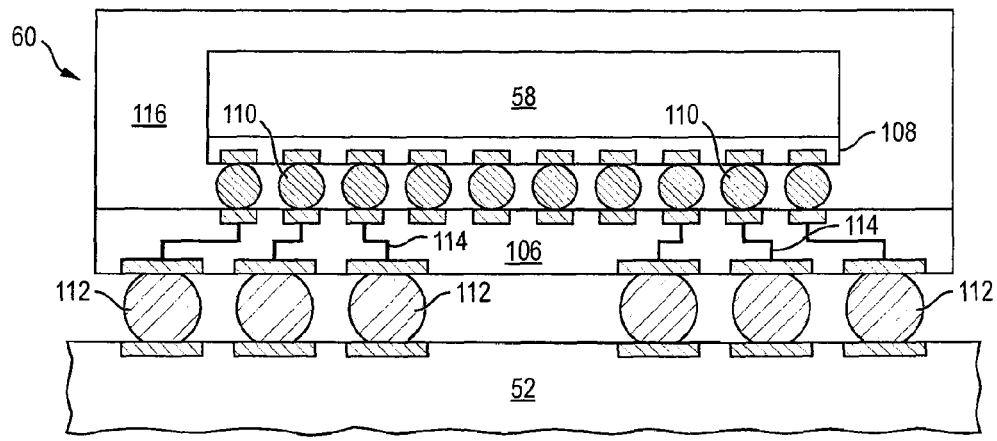

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 3b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110. BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 4E:
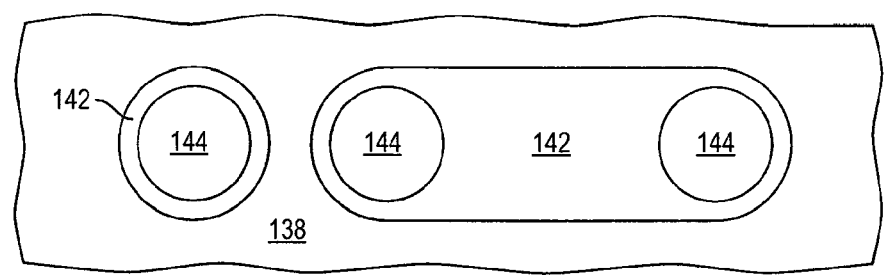
FIGS. 4a-4h illustrate a process of forming a bump structure with two-layer UBM around a bump formation area.
Figure 4G:
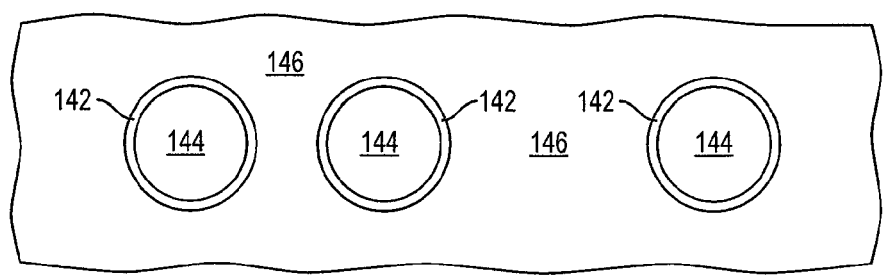
Figure 4A:
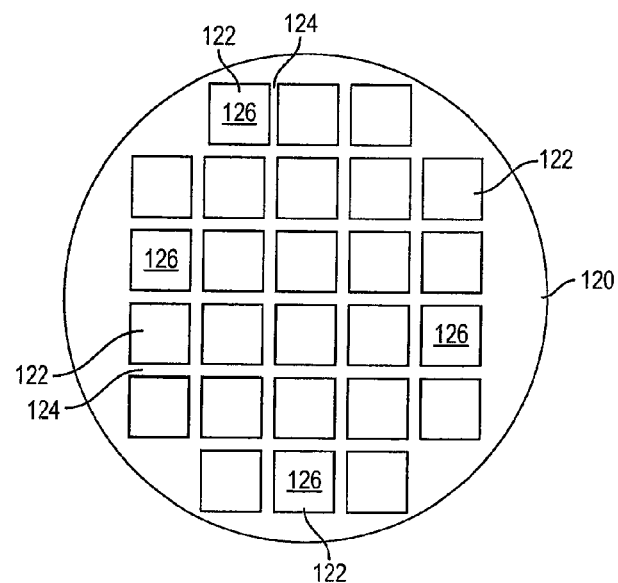

FIGS. 4a-4h illustrate, in relation to FIGS. 2 and 3a-3c, a process of forming a bump structure with a two-layer UBM around a bump formation area. FIG. 4a shows a semiconductor wafer 120 containing a base substrate material such as silicon, germanium, gallium arsenide, indium phosphide, or silicon carbide, for structural support. A plurality of semiconductor die 122 is formed on semiconductor wafer 120 separated by saw streets 124 using the processes described above. Each semiconductor die or component 122 has an active surface 126 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 126 to implement analog circuits or digital circuits, such as digital signal processor (DSP), ASIC, memory, or other signal processing circuit. Semiconductor die 122 may also contain integrated passive devices (IPDs), such as inductors, capacitors, and resistors, for RF signal processing.

Figure 4B:
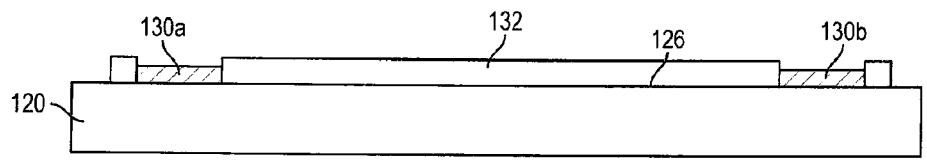

In FIG. 4b, an electrically conductive layer 130a and 130b is formed over active surface 126 of semiconductor wafer 120 using a patterning and deposition process such as PVD, CVD, sputtering, electrolytic plating, and electroless plating. Conductive layer 130a and 130b can be one or more layers of Al, Cu, Sn, Ni, Au, Ag, or other suitable electrically conductive material. Conductive layer 130a and 130b are metal interconnect pads, which are electrically connected to circuitry on active surface 126.

An insulating or passivation layer 132 is formed over active surface 126 of substrate 120 and conductive layer 130 using PVD, CVD, printing, spin coating, spray coating, sintering or thermal oxidation. The insulating layer 132 can be one or more layers of silicon dioxide (SiO2), silicon nitride (Si3N4), silicon oxynitride (SiON), tantalum pentoxide (Ta2O5), aluminum oxide (Al2O3), photo sensitive polymer dielectric (e.g. polyimide, WPR, PBO, BCB), or other material having similar insulating and structural properties. A portion of insulating layer 132 is removed by an etching process to expose conductive layer 130a and 130b.

Figure 4C:
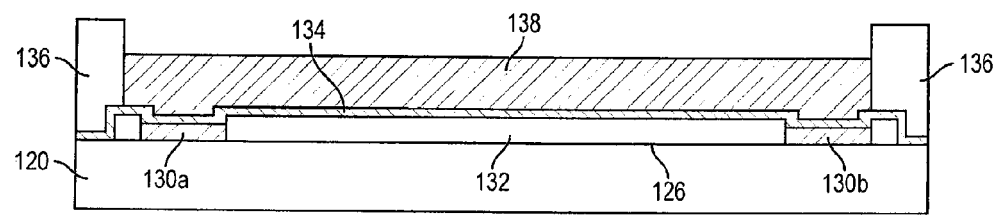

In FIG. 4c, a seed layer 134 is formed over conductive layer 130 and insulating layer 132 using a patterning and deposition process such as electrolytic plating and electroless plating. Seed layer 134 can be Ti/Cu, TiW/Cu, Ta/Cu, Cr/Cu, Ni, Ti(TiW, Cr, Al)/NiV(Cr, TaN)/Cu, nickel vanadium (NiV), Au, or Al.

A photoresist layer 136 is deposited on seed layer 134. A portion of photoresist layer 136 over conductive layer 130a and 130b and seed layer 134 is patterned by exposure and removed by an etching process. An electrically conductive layer 138 is formed over seed layer 134 in the removed portion of photoresist layer 136 using a deposition process such as PVD, CVD, sputtering, electrolytic plating, and electroless plating. Conductive layer 138 can be one or more layers of Al, Cu, Sn, Ni, Au, Ag, or other suitable electrically conductive material. Conductive layer 138 operates as an RDL to extend the interconnectivity of interconnect pads 130a and 130b. Conductive layer 138 can be continuous between interconnect pads 130a and 130b or electrically isolated between the interconnect pads. In one embodiment, conductive layer 138 is selectively plated Cu in the patterned photoresist layer 136. Seed layer 134 operates as a barrier layer and wetting layer for Cu conductive layer 138.

Figure 4D:
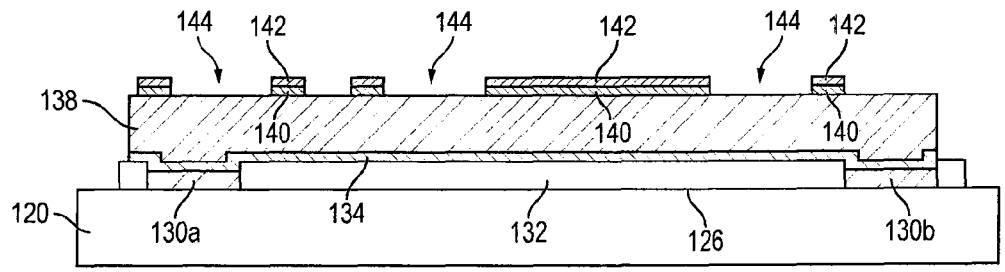

In FIG. 4d, photoresist layer 136 is removed. An electrically conductive layer 140 is formed over conductive layer 138 around bump or interconnect formation area 144 designated for later formation of interconnect bumps. An electrically conductive layer 142 is formed over conductive layer 140. Conductive layers 140 and 142 can be one or more layers of suitable electrically conductive material deposited using a patterning and deposition process such as PVD, CVD, sputtering, electrolytic plating, and electroless plating. Conductive layers 140 and 142 form a multi-layer metallization pattern or UBM including a barrier layer and adhesion layer. In one embodiment, conductive layer 140 is the barrier layer containing Ni, NiV, TiW, chromium copper (CrCu), platinum (Pt), or palladium (Pd). Conductive layer 142 is the adhesion layer containing Al, titanium (Ti), chromium (Cr), or titanium nitride (TiN). UBM 140-142 provides a low resistive interconnect, as well as a barrier to Cu or solder diffusion into active surface 126.

FIG. 4e shows a top view of UBM 140-142 with bump formation area 144. In one embodiment, UBM 140-142 is patterned and deposited as a ring completely around, or as an enclosing structure with respect to, bump formation area 144. Bump formation area 144 is thus central to UBM 140-142. Alternatively, UBM 140-142 is deposited over area 144 and then etched from area 144 to form the ring or enclosing structure. In other embodiment, UBM 140-142 is formed partially around area 144.

Figure 4F:
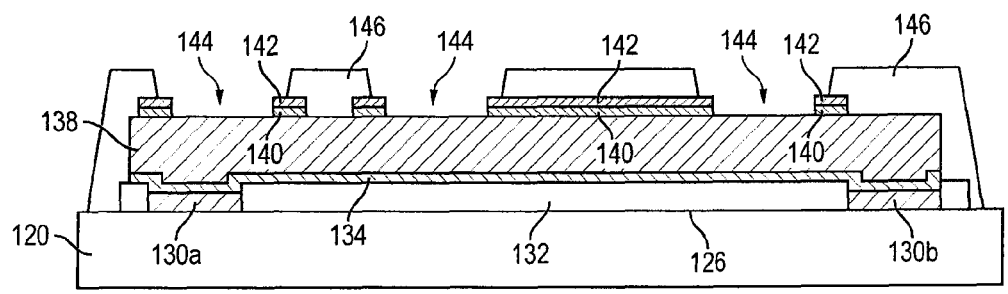

In FIG. 4f, an insulating or passivation layer 146 formed over conductive layers 138 and UBM 140-142 and substrate 120 using PVD, CVD, printing, spin coating, spray coating, sintering or thermal oxidation. The insulating layer 146 can be one or more layers of SiO2, Si3N4, SiON, Ta2O5, Al2O3, or other material having similar insulating and structural properties. A portion of insulating layer 146 is removed by an etching process to expose conductive layer 138 in area 144 and a portion of UBM 140-142 around the perimeter of area 144. FIG. 4g shows a top view of insulating layer 146 covering a portion of UBM 140-142. The remaining portion of UBM 140-142, not covered by insulating layer 146, forms the ring completely around bump formation area 144. The insulating layer 146 is then cured.

Figure 4H:
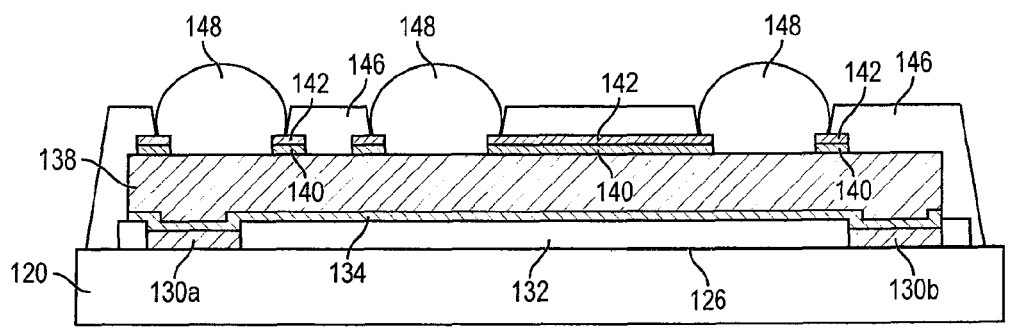

In FIG. 4h, an electrically conductive bump material is deposited over area 144 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 138 and UBM 140-142 using a suitable attachment or bonding process. In one embodiment, the bump material is reflowed by heating the material above its melting point to form spherical balls or bumps 148. In some applications, bumps 148 are reflowed a second time to improve electrical contact to conductive layer 138 and UBM 140-142. The bumps can also be compression bonded to conductive layer 138 and UBM 140-142. Bumps 148 represent one type of interconnect structure that can be formed over conductive layer 138 and UBM 140-142. The interconnect structure can also use stud bumps, micro bumps, conductive pillars, or other electrical interconnect.

The circuitry on active surface 126 is electrically connected through interconnect pads 130a and 130b, RDL 138, and bumps 148 to external devices. Bumps 148 contact UBM 140-142, although insulating layer 146 may or may not contact bumps 148. In any case, delamination of insulating layer 146 is no longer a reliability issue because the enclosing structure of UBM 140-142 around bumps 148 maintains the seal of the contact interface between bumps 148 and conductive layer 138. Conductive layer 140 is the barrier layer to inhibit Cu diffusion and conductive layer 142 is the adhesion layer to form a moisture tight seal against bumps 148. UBM 140-142 increases reliability by preventing moisture from penetrating to the contact interface between bumps 148 and conductive layer 138, which could cause oxidation and weakening of the contact interface. UBM 140-142 reduces inspection rejection or failure of the device.

Figure 5:
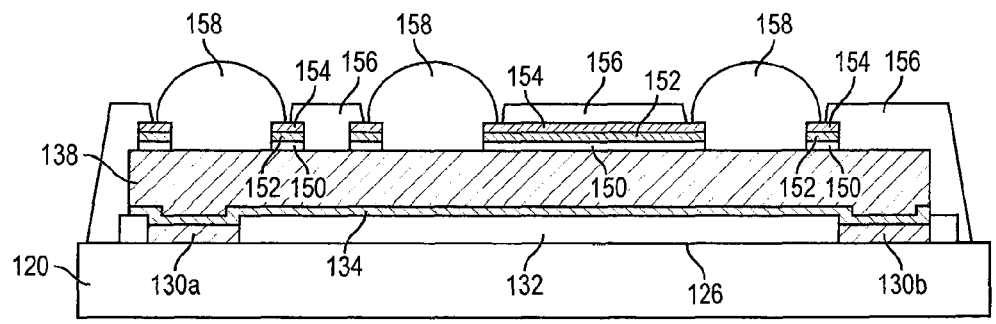
FIG. 5 illustrates another bump structure with three-layer UBM formed around a base of the bump.

In another embodiment, continuing with the structure described up to FIG. 4c, photoresist layer 136 is removed and an electrically conductive layer 150 is formed over conductive layer 138 around bump or interconnect formation area 144 designated for later formation of interconnect bumps, as shown in FIG. 5. An electrically conductive layer 152 is formed over conductive layer 150, and an electrically conductive layer 154 is formed over conductive layer 152. Conductive layers 150-154 can be one or more layers of suitable electrically conductive material deposited using a patterning and deposition process such as PVD, CVD, sputtering, electrolytic plating, and electroless plating. Conductive layers 150-154 form a multi-layer metallization pattern or UBM including a barrier layer between adhesion layers. In one embodiment, conductive layer 154 is an adhesion layer containing Al, Ti, Cr, TiN, or TiW; conductive layer 152 is a barrier layer containing Ni, NiV, TiW, CrCu, NiV, Pt, or Pd; and conductive layer 150 is an adhesion layer containing Al, Ti, Cr, TiN, or TiW. The top view of UBM 150-154 is similar to FIG. 4e. UBM 150-154 provides a low resistive interconnect, as well as a barrier to Cu or solder diffusion into active surface 126.

An insulating or passivation layer 156 is formed over conductive layers 138 and UBM 150-154 using PVD, CVD, printing, spin coating, spray coating, sintering or thermal oxidation. The insulating layer 156 can be one or more layers of SiO2, Si3N4, SiON, Ta2O5, Al2O3, or other material having similar insulating and structural properties. A portion of insulating layer 156 is removed by an etching process to expose conductive layer 138 in area 144 and a portion of UBM 150-154, similar to FIG. 4g. The insulating layer 156 covers a portion of UBM 150-154. The remaining portion of UBM 150-154, not covered by insulating layer 156, forms the ring completely around bump formation area 144. The insulating layer 156 is then cured.

An electrically conductive bump material is deposited over area 144 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 138 and UBM 150-154 using a suitable attachment or bonding process. In one embodiment, the bump material is reflowed by heating the material above its melting point to form spherical balls or bumps 158. In some applications, bumps 158 are reflowed a second time to improve electrical contact to conductive layer 138 and UBM 150-154. The bumps can also be compression bonded to conductive layer 138 and UBM 150-154. Bumps 158 represent one type of interconnect structure that can be formed over conductive layer 138 and UBM 150-154. The interconnect structure can also use stud bumps, micro bumps, conductive pillars, or other electrical interconnect.

The circuitry on active surface 126 is electrically connected through interconnect pads 130a and 130b, RDL 138, and bumps 158 to external devices. Bumps 158 contact UBM 150-154, although insulating layer 156 may or may not contact bumps 158. In any case, delamination of insulating layer 156 is no longer a reliability issue because the enclosing structure of UBM 150-154 around bumps 158 maintains the seal of the contact interface between bumps 158 and conductive layer 138. UBM 150-154 increases reliability by preventing moisture from penetrating to the contact interface between bumps 158 and conductive layer 138, which could cause oxidation and weakening of the contact interface. UBM 150-154 reduces inspection rejection or failure of the device.

Figure 6:
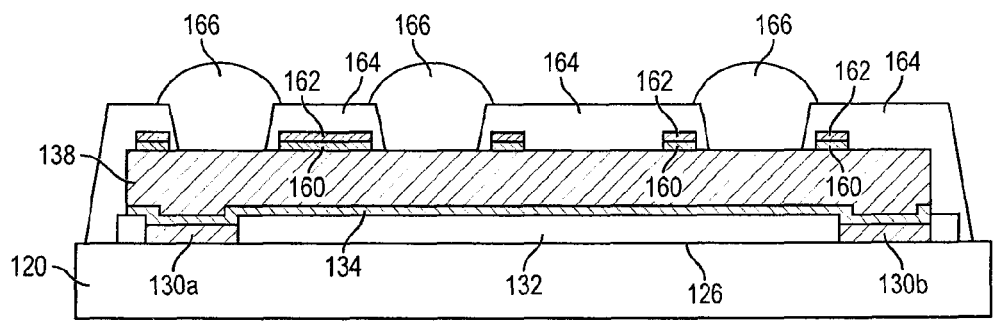
FIG. 6 illustrates another bump structure with the passivation layer contacting the bump.

In another embodiment, continuing with the structure described up to FIG. 4c, photoresist layer 136 is removed and an electrically conductive layer 160 is formed over conductive layer 138 around central bump formation area 144 designated for later formation of interconnect bumps, as shown in FIG. 6. An electrically conductive layer 162 is formed over conductive layer 160. Conductive layers 160-162 can be one or more layers of suitable electrically conductive material deposited using a patterning and deposition process such as PVD, CVD, sputtering, electrolytic plating, and electroless plating. Conductive layers 160-162 form a multi-layer metallization pattern or UBM including a barrier layer between adhesion layers. In one embodiment, conductive layer 162 is an adhesion layer containing Al, Ti, Cr, TiN, or TiW, and conductive layer 160 is a barrier layer containing Ni, NiV, TiW, CrCu, NiV, Pt, or Pd. UBM 160-162 provides a low resistive interconnect, as well as a barrier to Cu or solder diffusion into active surface 126.

In one embodiment, UBM 160-162 is patterned and deposited as a ring completely around, or as an enclosing structure with respect to, bump formation area 144. Bump formation area 144 is thus central to UBM 160-162. Alternatively, UBM 160-162 is deposited over area 144 and then etched from area 144 to form the ring or enclosing structure.

An insulating or passivation layer 164 is formed over conductive layers 138 and UBM 160-162 and substrate 120 using PVD, CVD, printing, spin coating, spray coating, sintering or thermal oxidation. The insulating layer 164 can be one or more layers of SiO2, Si3N4, SiON, Ta2O5, Al2O3, or other material having similar insulating and structural properties. A portion of insulating layer 164 is removed by an etching process to expose conductive layer 138 in area 144 and a portion of UBM 160-162. The insulating layer 164 is then cured.

An electrically conductive bump material is deposited over area 144 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 138 and UBM 160-162 using a suitable attachment or bonding process. In one embodiment, the bump material is reflowed by heating the material above its melting point to form spherical balls or bumps 166. In some applications, bumps 166 are reflowed a second time to improve electrical contact to conductive layer 138 and UBM 160-162. The bumps can also be compression bonded to conductive layer 138 and UBM 160-162. Bumps 166 represent one type of interconnect structure that can be formed over conductive layer 138 and UBM 160-162. The interconnect structure can also use stud bumps, micro bumps, conductive pillars, or other electrical interconnect.

The circuitry on active surface 126 is electrically connected through interconnect pads 130a and 130b, RDL 138, and bumps 158 to external devices. The insulating layer 164 contacts bumps 166. However, delamination of insulating layer 164 is still no longer a reliability issue because UBM 160-162 maintains the seal of the contact interface between bumps 166 and conductive layer 138. UBM 160-162 increases reliability by preventing moisture from penetrating to the contact interface between bumps 166 and conductive layer 138, which could cause oxidation and weakening of the contact interface. UBM 160-162 reduces rejection or failure of the device.

Figure 7:
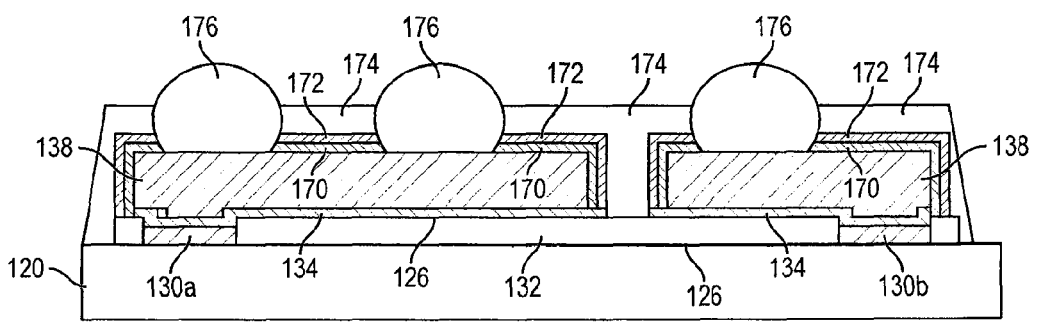
FIG. 7 illustrates another bump structure with continuous two-layer UBM formed around a base of the bump.

In another embodiment, continuing with the structure described up to FIG. 4c, photoresist layer 136 is removed and an electrically conductive layer 170 is formed over conductive layer 138, as shown in FIG. 7. Conductive layer 170 covers conductive layer 138, except for central bump formation area 144 which is designated for later formation of interconnect bumps. An electrically conductive layer 172 is formed over conductive layer 170. Conductive layers 170 and 172 can be one or more layers of suitable electrically conductive material deposited using a patterning and deposition process such as PVD, CVD, sputtering, electrolytic plating, and electroless plating. Conductive layers 170-172 form a multilayer metallization pattern or UBM including a barrier layer and adhesion layer. In one embodiment, conductive layer 170 is the barrier layer containing Ni, NiV, TiW, CrCu, NiV, Pt, or Pd. Conductive layer 172 is the adhesion layer containing Al, Ti, Cr, TiN, or TiW. UBM 170-172 provides a low resistive interconnect, as well as a barrier to Cu or solder diffusion into active surface 126.

An insulating or passivation layer 174 is formed over conductive layers 138 and UBM 170-172 and substrate 120 using PVD, CVD, printing, spin coating, spray coating, sintering or thermal oxidation. The insulating layer 174 can be one or more layers of SiO2, Si3N4, SiON, Ta2O5, Al2O3, or other material having similar insulating and structural properties. A portion of insulating layer 174 is removed by an etching process to expose conductive layer 138 in area 144 and a portion of UBM 170-172. That is, the insulating layer 164 covers a portion of UBM 170-172. The remaining portion of UBM 170-172, not covered by insulating layer 164, forms the ring completely around bump formation area 144. The insulating layer 174 is then cured.

An electrically conductive bump material is deposited over area 144 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 138 and UBM 170-172 using a suitable attachment or bonding process. In one embodiment, the bump material is reflowed by heating the material above its melting point to form spherical balls or bumps 176. In some applications, bumps 176 are reflowed a second time to improve electrical contact to conductive layer 138 and UBM 170-172. The bumps can also be compression bonded to conductive layer 138 and UBM 170-172. Bumps 176 represent one type of interconnect structure that can be formed over conductive layer 138 and UBM 170-172. The interconnect structure can also use stud bumps, micro bumps, conductive pillars, or other electrical interconnect.

The circuitry on active surface 126 is electrically connected through interconnect pads 130a and 130b, RDL 138, and bumps 176 to external devices. Bumps 176 contact UBM 170-172, although insulating layer 174 may or may not contact bumps 176. In any case, delamination of insulating layer 174 is no longer a reliability issue because UBM 170-172 maintains the seal of the contact interface between bumps 176 and conductive layer 138. UBM 170-172 increases reliability by preventing moisture from penetrating to the contact interface between bumps 176 and conductive layer 138, which could cause oxidation and weakening of the contact interface. UBM 170-172 reduces inspection rejection or failure of the device.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a first conductive layer over the substrate;
   forming a first insulating layer over the substrate;
   forming a second conductive layer over the first conductive layer and first insulating layer;
   forming an under bump metallization (UBM) layer around a bump formation area over a major surface of the second conductive layer and over side surfaces of the second conductive layer with respect to the major surface, the second conductive layer being exposed in the bump formation area;
   forming a second insulating layer over the UBM layer and second conductive layer;
   and
   forming a bump over the second conductive layer in the bump formation area, the bump contacting the UBM layer to seal a contact interface between the bump and second conductive layer.

2. The method of claim 1, wherein forming the UBM layer includes:
   forming a third conductive layer over the second conductive layer; and
   forming a fourth conductive layer over the third conductive layer, the fourth conductive layer being in contact with the bump.

3. The method of claim 2, wherein the fourth conductive layer includes a material selected from the group consisting of aluminum, titanium, chromium, titanium nitride, and titanium tungsten.

4. The method of claim 1, wherein forming the UBM layer includes:
   forming a third conductive layer over the second conductive layer;
   forming a fourth conductive layer over the third conductive layer; and
   forming a fifth conductive layer over the fourth conductive layer, the fifth conductive layer being in contact with the bump.

5. The method of claim 1, wherein the second insulating layer contacts the bump.

6. The method of claim 1, further including forming a seed layer over the first conductive layer and first insulating layer prior to forming the second conductive layer.

7. A method of making a semiconductor device, comprising:
   providing a substrate;
   forming a first conductive layer over the substrate;
   forming a first insulating layer over the substrate;
   forming a second conductive layer over the first conductive layer and first insulating layer;
   forming a multi-layer metallization pattern around an interconnect formation area over the second conductive layer, the second conductive layer being exposed in the interconnect formation area;

forming a second insulating layer over the multi-layer metallization pattern and contacting the second conductive layer within the interconnect formation area; and forming an interconnect structure over the second conductive layer in the interconnect formation area.

8. The method of claim 7, wherein forming the multi-layer metallization pattern includes:

forming a third conductive layer over the second conductive layer; and forming a fourth conductive layer over the third conductive layer, the fourth conductive layer being in contact with the interconnect structure.

9. The method of claim 8, wherein the fourth conductive layer includes a material selected from the group consisting of aluminum, titanium, chromium, titanium nitride, and titanium tungsten.

10. The method of claim 7, wherein forming the multi-layer metallization pattern includes:

forming a third conductive layer over the second conductive layer;

forming a fourth conductive layer over the third conductive layer; and forming a fifth conductive layer over the fourth conductive layer, the fifth conductive layer being in contact with the interconnect.

11. The method of claim 7, wherein the interconnect structure includes a bump.

12. The method of claim 7, wherein the multi-layer metallization pattern covers the second conductive layer outside the interconnect formation area.

13. The method of claim 7, further including forming a seed layer over the first conductive layer and first insulating layer prior to forming the second conductive layer.

14. A method of making a semiconductor device, comprising:

providing a substrate;

forming a first conductive layer over the substrate;

forming a multi-layer metallization pattern around an interconnect formation area over the first conductive layer;

forming a first insulating layer over the multi-layer metallization pattern and over the first conductive layer outside the multi-layer metallization pattern; and forming an interconnect over the first conductive layer in the interconnect formation area.

15. The method of claim 14, further including:

forming a second conductive layer over the substrate prior to forming the first conductive layer;

forming a second insulating layer over the substrate; and forming a seed layer over the second conductive layer and second insulating layer.

16. The method of claim 14, wherein forming the multi-layer metallization pattern includes:

forming a second conductive layer over the first conductive layer; and forming a third conductive layer over the second conductive layer, the third conductive layer being in contact with the interconnect.

17. The method of claim 14, wherein forming the multi-layer metallization pattern includes:

forming a second conductive layer over the first conductive layer;

forming a third conductive layer over the second conductive layer; and forming a fourth conductive layer over the third conductive layer, the fourth conductive layer being in contact with the interconnect.

18. The method of claim 14, wherein the interconnect includes a bump.

19. A semiconductor device, comprising:

a semiconductor die;

a first conductive layer formed over the semiconductor die;

a first insulating layer formed over the semiconductor die;

a second conductive layer formed over the first conductive layer and first insulating layer;

a multi-layer metallization pattern formed around an interconnect formation area over the second conductive layer;

a second insulating layer formed over the multi-layer metallization pattern and over the second conductive layer outside the multi-layer metallization pattern; and an interconnect structure formed over the second conductive layer in the interconnect formation area.

20. The semiconductor device of claim 19, further including:

a third conductive layer formed over the second conductive layer; and a fourth conductive layer formed over the third conductive layer, the fourth conductive layer being in contact with the interconnect structure.

21. The semiconductor device of claim 19, further including:

a third conductive layer formed over the second conductive layer;

a fourth conductive layer formed over the third conductive layer; and a fifth conductive layer formed over the fourth conductive layer, the fifth conductive layer being in contact with the interconnect structure.

22. The semiconductor device of claim 19, wherein the interconnect structure includes a bump.

23. The semiconductor device of claim 19, wherein the multi-layer metallization pattern covers the second conductive layer outside the interconnect formation area.

24. The semiconductor device of claim 19, further including a seed layer formed over the first conductive layer and first insulating layer prior to forming the second conductive layer.

* * * * *